(12) United States Patent
Masaoka

(10) Patent No.: US 10,516,387 B2
(45) Date of Patent: Dec. 24, 2019

(54) SIGNAL LEVEL CONVERTER AND DISPLAY DRIVING DEVICE

(71) Applicant: SHARP KABUSHIKI KAISHA, Sakai, Osaka (JP)

(72) Inventor: Akira Masaoka, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/203,153

(22) Filed: Nov. 28, 2018

(65) Prior Publication Data

US 2019/0165771 A1 May 30, 2019

(30) Foreign Application Priority Data

Nov. 29, 2017 (JP) ................. 2017-229462

(51) Int. Cl.
*H03K 3/356* (2006.01)
*G09G 3/20* (2006.01)
*H03K 19/0185* (2006.01)

(52) U.S. Cl.
CPC ......... *H03K 3/356113* (2013.01); *G09G 3/20* (2013.01); *H03K 19/018507* (2013.01); *G09G 2310/0289* (2013.01); *G09G 2310/0291* (2013.01)

(58) Field of Classification Search
CPC .... H03K 19/094; H03K 17/162; H03K 19/20; H03K 3/0315; H03K 17/102; H03K 17/161; H03K 17/687; H03K 17/163; H03K 3/013; H03K 3/017; H03K 5/08
USPC .................. 327/108, 109, 110, 111, 112, 333
See application file for complete search history.

(56) References Cited

U.S. PATENT DOCUMENTS

| | | | |
|---|---|---|---|
| 6,836,148 B2 * | 12/2004 | Pullen .............. | H03K 19/00315 326/68 |
| 2007/0063749 A1 * | 3/2007 | Fan ........................ | H03K 5/133 327/158 |
| 2014/0015587 A1 * | 1/2014 | Chen ...................... | H03K 3/012 327/333 |

FOREIGN PATENT DOCUMENTS

JP 2012-033987 A 2/2012

* cited by examiner

*Primary Examiner* — John W Poos
(74) *Attorney, Agent, or Firm* — ScienBiziP, P.C.

(57) ABSTRACT

A signal level converter includes a bias generating circuit that generates a bias voltage, and a level shifter circuit that converts a lower voltage signal into a higher voltage signal in response to the bias voltage. The bias generating circuit includes a replica circuit that controls an on-current of the level shifter circuit in response to the bias voltage output from an operational amplifier.

9 Claims, 13 Drawing Sheets

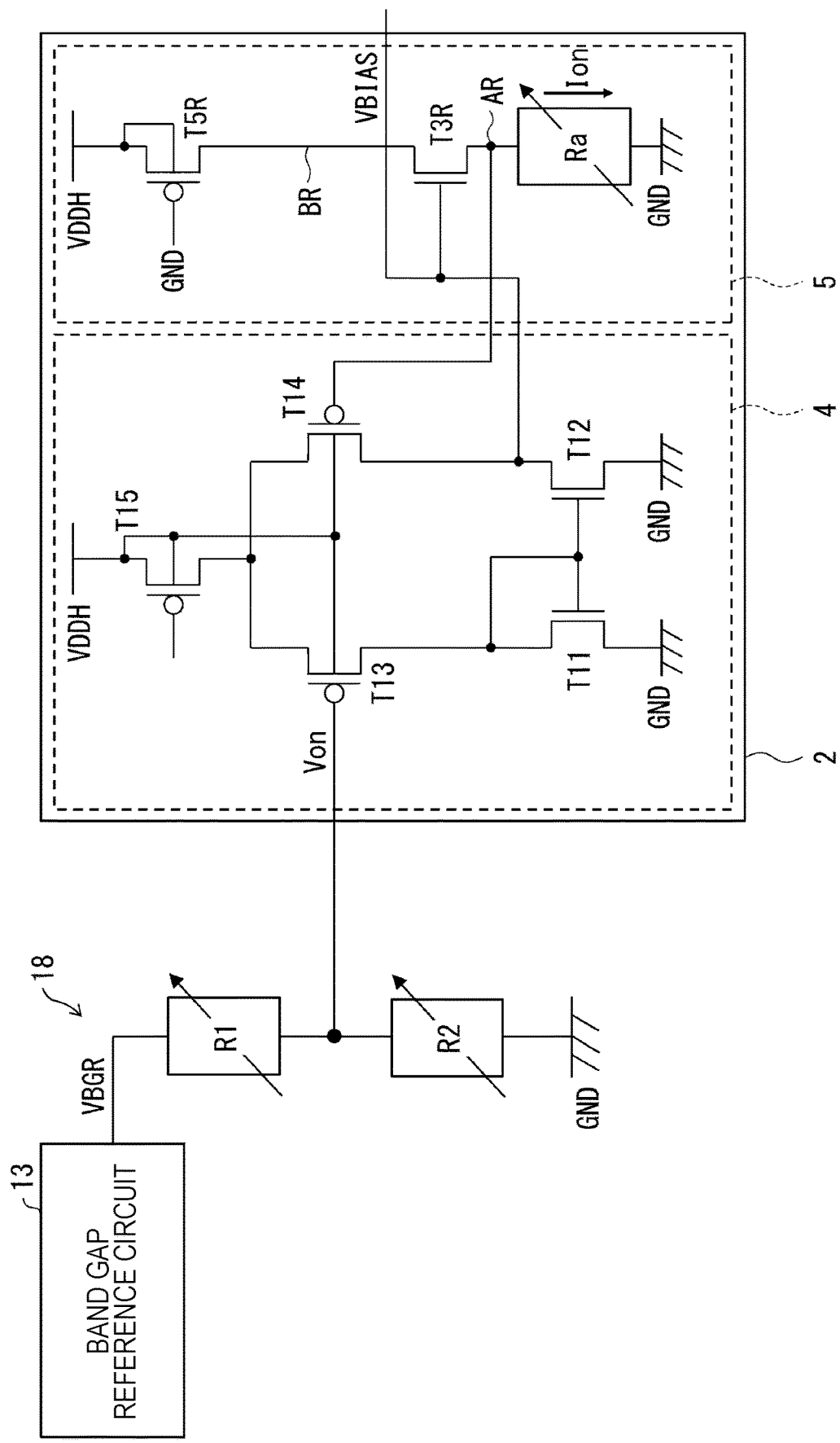

SIGNAL LEVEL CONVERTER AND DISPLAY DRIVING DEVICE

BACKGROUND

1. Field

The present disclosure relates to a signal level converter and a display driving device.

2. Description of the Related Art

A level shifter circuit converts an input signal at a lower voltage level into an output signal at a higher voltage level. An input transistor receiving the input signal is connected to a node to which a higher voltage is applied. For this reason, the input transistor includes a higher withstand voltage transistor to control breakdown.

The threshold voltage Vth of the higher voltage transistor is typically higher. A sufficient on-current is thus difficult to flow into the input transistor, and this makes it difficult for the input transistor to operate normally.

Japanese Unexamined Patent Application Publication No. 2012-33987 discloses a level shifter circuit that causes a higher voltage not to be applied to an input transistor while allowing a sufficient on-current to flow through the input transistor.

FIG. 12 illustrates a level shifter circuit 93 disclosed in Japanese Unexamined Patent Application Publication No. 2012-33987. The level shifter circuit 93 includes an N-type transistor T1 with the gate receiving an input signal IN at a lower power source voltage VDDL, an inverter INV that outputs an inverted signal of the input signal IN, an N-type transistor T2 with the gate thereof receiving the inverted signal output from the inverter INV, and P-type transistors T5 and T6.

The N-type transistors T1 and T2 are a lower withstand voltage N-type transistor or a medium withstand voltage N-type transistor, each having a lower threshold voltage Vth, and thus allows a sufficient on-current to flow. The gate of the higher withstand voltage P-type transistor T5 is connected to the drain of the higher withstand voltage P-type transistor T6. The gate of the higher withstand voltage P-type transistor T6 is connected to the drain of the higher withstand voltage P-type transistor T5.

In this specification, the lower withstand voltage N-type transistor or the medium withstand voltage N-type transistor may be referred to as a lower to medium withstand voltage N-type transistor. Let VDDL represent a withstand voltage of the lower to medium withstand voltage transistor, Vthl a threshold voltage of the lower to medium withstand voltage transistor, VDDH a withstand voltage of the higher withstand voltage transistor, and Vthh a threshold voltage of the higher withstand voltage transistor, and a relationship of VDDL<VDDH and Vthl<Vthh holds true.

If a lower or a lower to medium withstand voltage N-type transistor is used for each of the N-type transistors T1 and T2, a higher voltage may be applied to each of nodes C and D respectively connected to the N-type transistors T1 and T2. In order to alleviate a high voltage that may possibly be applied to the lower or lower to medium N-type transistors T1 and T2, a higher withstand voltage N-type transistor T3 is inserted between the N-type transistor T1 and the P-type transistor T5, and a higher withstand voltage N-type transistor T4 is inserted between the N-type transistor T2 and the P-type transistor T6.

A bias voltage VBIAS serving as an intermediate voltage is applied to the node of the gates of the higher withstand voltage N-type transistors T3 and T4 such that the node C and D do not reach a higher potential. In such a case, the output signal OUT of the level shifter circuit 93 is an output that is varied over a full amplitude from 0 V (ground voltage GND) to a higher power source voltage VDDH in response to the amplitude of the input signal IN.

The bias voltage VBIAS is generated by a bias generating circuit 92. The bias generating circuit 92 includes a N-type transistor T7 and a resistor R connected between the higher power source voltage VDDH and the ground voltage GND.

If variations occur in manufacturing process and in the higher power source voltage VDDH in the bias generating circuit 92 of FIG. 12, the bias voltage VBIAS varies. The on-current of the level shifter circuit 93 also varies.

If the bias voltage VBIAS decreases, the on-current of the level shifter circuit 93 is difficult to obtain, and the operation of the level shifter circuit 93 becomes unstable. On the other hand, if the bias voltage VBIAS increases, the on-current of the level shifter circuit 93 is obtained, but a higher voltage may be applied to the lower withstand voltage or lower to medium withstand voltage N-type transistors T1 and T2, possibly causing the N-type transistors T1 and T2 to break down or to be degraded.

As microfabrication of the lower or lower to medium withstand voltage transistors has advanced recently, the withstand voltage thereof decreases accordingly. Stable operation and reliability of a level shifter circuit are thus difficult to achieve. For this reason, an accurate bias voltage VBIAS is typically used. More specifically, the bias voltage VBIAS is set to be an optimum value In view of variations in a manufacturing process and an operation environment to provide the on-current of the level shifter circuit and to ensure reliability of the lower or lower to medium withstand voltage transistor. The bias generating circuit 92 of FIG. 12 is not suitable for generating such a bias voltage VBIAS.

A display driving device (integrated circuit) uses multiple voltage levels, such as a voltage for signal processing, a voltage for a display driving signal, and a voltage for a display gradation signal. For this reason, the display driving device typically uses multiple level shifter circuits. Since the display driving device outputs multiple display driving output signals, it has naturally an elongated shape.

The display driving device thus suffers from a difference in the ground voltage GND caused by wiring resistance, and variations in transistor characteristics due to heating caused in a circuit close to the level shifter circuit. Characteristics of the level shifter circuit vary depending on a wiring of the display driving device and a layout of the level shifter circuit with respect to the circuit close thereto. The bias voltage VBIAS is to be generated in view of the environment where the level shifter circuit is mounted. Variations in the characteristics of the level shifter circuit may be improved by mounting the bias generating circuit close to the level shifter circuit. However, mounting the bias generating circuit on a dense layout region of the display driving device where multiple display output circuits are mounted leads to an increase in the layout area. Even if the level shifter circuit is mounted at a location part from the bias generating circuit, the bias voltage VBIAS in view of the variations in the characteristics of the level shifter circuit depending on the location of the layout is desirably generated without increasing the layout area.

It is desirable to provide a signal level converter and a display driving device that control an on-current of a level shifter circuit at a higher accuracy level.

SUMMARY

According to an aspect of the disclosure, there is provided a signal level converter. The signal level converter includes a bias generating circuit that generates a bias voltage, and a level shifter circuit that converts a lower voltage signal into a higher voltage signal in response to the bias voltage. The bias generating circuit includes an operational amplifier that outputs the bias voltage, and a replica circuit that controls an on-current of the level shifter circuit in response to the bias voltage output from the operational amplifier.

According to another aspect of the disclosure, there is provided a display driving device. The display driving device includes at least one first block including a bias generating circuit that generates a bias voltage, a voltage to current converting circuit that converts the bias voltage generated by the bias generating circuit into a bias current signal and outputs the bias current signal, and a control signal generating circuit that generates a control signal, and at least one second block including a display driving signal generating block that generates a display driving signal, a current to voltage converting circuit that converts the bias current signal output from the voltage to current converting circuit into the bias voltage, and a level shifter circuit that converts a lower voltage signal into a higher voltage signal in response to the bias voltage. The number of the second blocks is higher than the number of the first blocks.

According to another aspect of the disclosure, there is provided a display driving device. The display driving device includes at least one first block including a bias generating circuit that generates a bias voltage, a voltage to current converting circuit that converts the bias voltage generated by the bias generating circuit into a bias current signal and outputs the bias current signal, a repeater circuit that distributes one output from the voltage to current converting circuit to a plurality of output branches, and a control signal generating circuit that generates a control signal, at least one second block including a display driving signal generating block that generates a display driving signal, a current to voltage converting circuit that converts the bias current signal output from the voltage to current converting circuit into the bias voltage, and a level shifter circuit that converts a lower voltage signal into a higher voltage signal in response to toe bias voltage, at least one third block including the current to voltage converting circuit, the level shifter circuit, and a current mirror circuit, and at least one fourth block including the display driving signal generating block, the current to voltage converting circuit, the level shifter circuit, and the repeater circuit. The current mirror circuit in the third block is connected to the repeater circuit in the fourth block. Each of the number of the third blocks and the number of the fourth blocks is higher than the number of the first blocks. The number of the second blocks is higher than each of the number of the third blocks and the number of the fourth blocks.

BRIEF DESCRIPTION OF THE DRAWINGS

FIG. 2 illustrates an on-voltage generating circuit that supplies an on-voltage to a bias generating circuit arranged in the signal level converter;

DESCRIPTION OF THE EMBODIMENTS

Embodiments of the disclosure are described in detail below.

First Embodiment

Figure 1A:
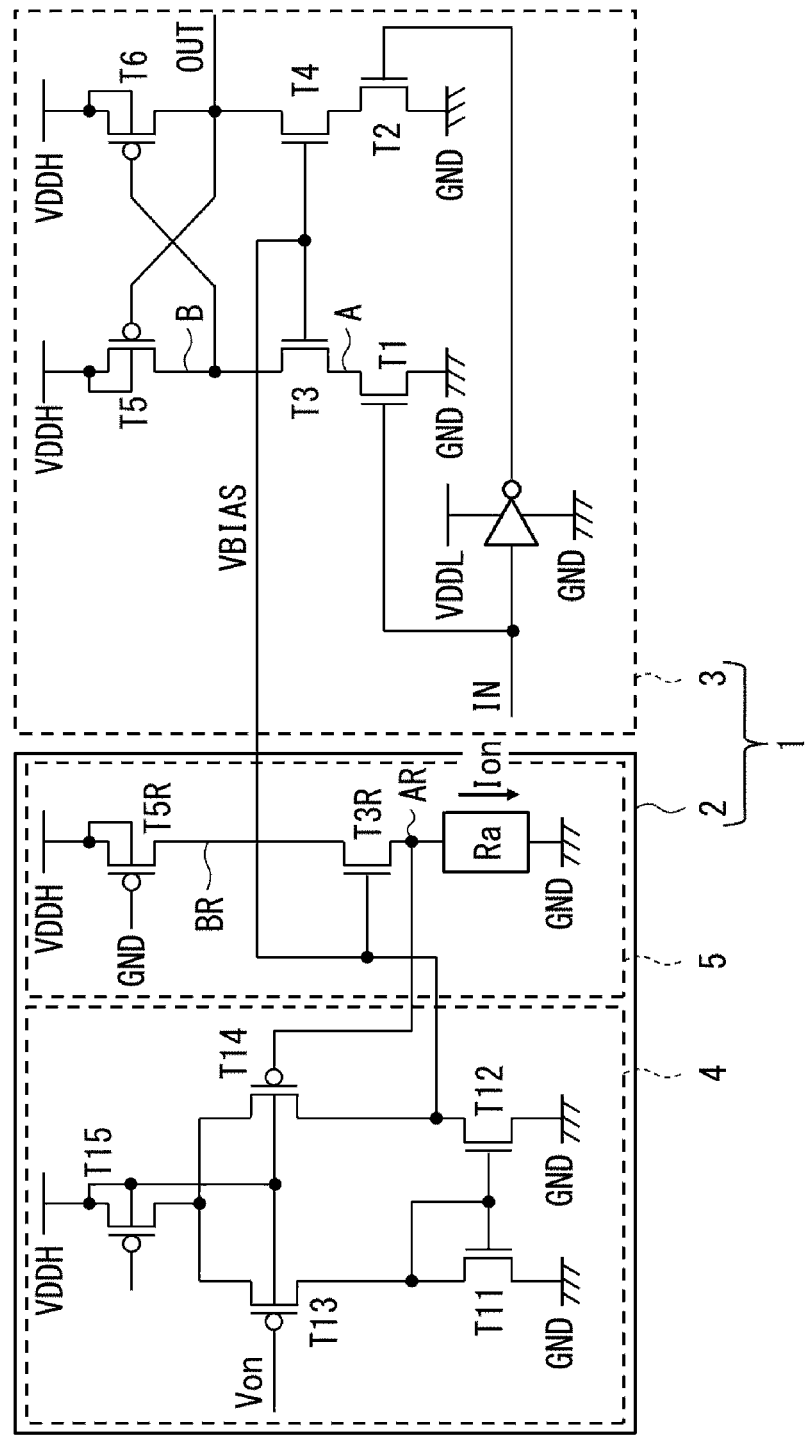
FIG. 1A is a circuit diagram of a signal level converter of a first embodiment.
Figure 1B:
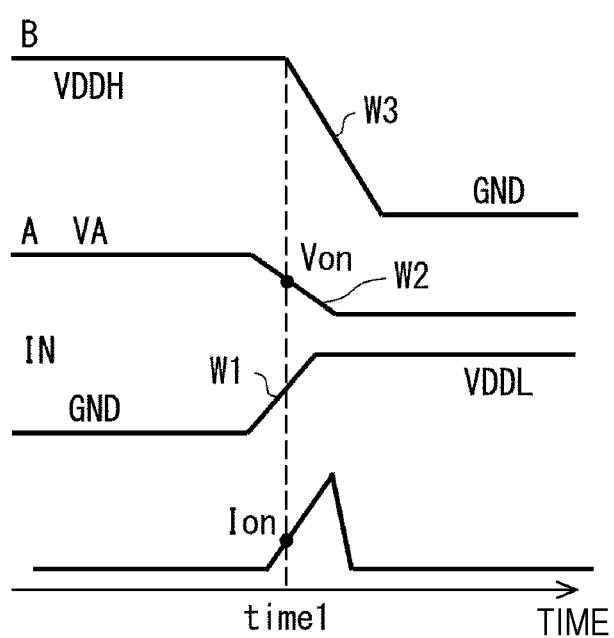
FIG. 1B is a transitional waveform diagram of internal voltages of a level shifter circuit arranged in the signal level converter.

FIG. 1A is a circuit diagram of a signal level converter 1 of a first embodiment, and FIG. 1B is a transitional waveform diagram of a level shifter circuit 3 arranged in the signal level converter 1.

The signal level converter 1 includes a bias generating circuit 2 that generates a bias voltage VBIAS, and the level shifter circuit 3 that converts an input signal IN into an output signal OUT in response to the bias voltage VBIAS. The bias generating circuit 2 includes an operational amplifier 4 that outputs the bias voltage VBIAS, and a replica circuit 5 that controls an on-current of the level shifter circuit 3 in response to the bias voltage VBIAS output from the operational amplifier 4.

The level shifter circuit 3 includes a first higher withstand voltage P-type transistor T5, a first higher withstand voltage N-type transistor T3, and a first lower to medium withstand voltage N-type transistor T1 connected in series in that order, and a second higher withstand voltage P-type transistor T6, a second higher withstand voltage N-type transistor T4, and a second lower to medium withstand voltage N-type transistor T2 connected in series in that order. The bias voltage VBIAS is applied to the node of the gate of the first higher withstand voltage N-type transistor T3 and the second higher withstand voltage N-type transistor T4.

The replica circuit 5 includes a replica P-type transistor T5R corresponding to the first higher withstand voltage P-type transistor T5 and a replica N-type transistor T3R corresponding to the first higher withstand voltage N-type transistor T3.

The replica circuit 5 includes an on-current control variable resistor Ra and a register that changes the value of the on-current control variable resistor Ra. The on-current control variable resistor Ra is connected to the side of the replica N-type transistor T3R opposite from the replica P-type transistor T5R in order to control the on-current flowing through the first lower to medium withstand voltage N-type transistor T1 of the level shifter circuit 3.

The transitional waveforms illustrated in FIG. 1B include a waveform W1 supplied to the gate of the first lower to medium withstand voltage N-type transistor T1, a voltage waveform W2 at a node A connected to the drain of the first lower to medium withstand voltage N-type transistor T1 and the source of the first higher withstand voltage N-type transistor T3, and a voltage waveform W3 at a node B connected to the drain of the first higher withstand voltage N-type transistor T3.

The level shifter circuit 3 operates as described below when the input signal IN transitions from the ground voltage GND to the lower power source voltage VDDL, and the voltage at the node B corresponding to the output signal OUT of the level shifter circuit 3 transitions from the higher power source voltage VDDH to the ground voltage GND.

When the input signal IN transitions from the ground voltage GND to the lower power source voltage VDDL, the first lower to medium withstand voltage N-type transistor T1 turns on, causing a voltage VA at the node A to decrease. When the voltage VA at the node A falls down to an on-voltage Von, the voltage difference between the gate and source of the first higher withstand voltage N-type transistor T3 becomes the voltage difference between the bias voltage VBIAS and the on-voltage Von, and the first higher withstand voltage N-type transistor T3 is turned on. This time point is referred to as time 1.

When the first higher withstand voltage N-type transistor T3 is turned on, an on-current Ion flows through the first higher withstand voltage P-type transistor T1, the first higher withstand voltage N-type transistor T3, and the first lower to medium withstand voltage N-type transistor T1 the level shifter circuit 3. The node B transitions from the higher power source voltage VDDH to the ground voltage GND as illustrated in FIG. 1B.

The bias generating circuit 2 of FIG. 1 may control the on-current Ion at a higher accuracy level, thereby controlling an operational speed of the level shifter circuit 3 at a higher accuracy level.

A method of controlling the on-current Ion on the bias generating circuit 2 is described below. The bias generating circuit 2 includes the operational amplifier 4 and the replica circuit 5. The replica N-type transistor T3R and the replica P-type transistor T5R in the replica circuit 5 have desirably the same channel lengths as the first higher withstand voltage N-type transistor T3 and the first higher withstand voltage F-type transistor T5 in the level shifter circuit 3 such that the replica N-type transistor T3R and the replica P-type transistor T5R are respectively identical in electrical characteristics to the first higher withstand voltage N-type transistor T3 and the first higher withstand voltage P-type transistor T5. The disclosure is not limited to this setting that the same channel lengths are employed.

If the on-voltage von is applied to the gate of a P-type transistor T13 of the operational amplifier 4, the operation of the operational amplifier 4 causes the voltage at the node AR to be the on-voltage Von, and the operational amplifier 4 outputs the bias voltage VBIAS.

The replica P-type transistor T5R in the replica circuit 5 is turned on, and the voltage at a node BR becomes the higher power source voltage VDDH. The bias voltage VBIAS is applied to the gate of the replica N-type transistor T3R, and the on-current Ion that is determined by dividing the on-voltage Von by the on-current control variable resistor Ra flows through the replica N-type transistor T3R and the on-current control variable resistor Ra.

A voltage as high as the bias voltage VBIAS that is applied to the gate of the replica N-type transistor T3R in the replica circuit 5 is applied to the gate of the first higher withstand voltage N-type transistor T3 in the level shifter circuit 3 at the time point time 1 when the first higher withstand voltage N-type transistor T3 is turned on. The bias voltage VBIAS is thus generated in view of the operational environment of the signal level converter 1. Including variations in manufacturing process, temperature, and substrate bias effect of the first higher withstand voltage N-type transistor T3. The on-current Ion of the level shifter circuit 3 is thus controlled at a higher accuracy level.

Referring to FIG. 2, an on-voltage generating circuit 18 is described. The on-voltage generating circuit 18 determines the on-current Ion by generating the on-voltage Von. The on-voltage generating circuit 18 includes a band gap reference circuit 13, a resistor R1, and a resistor R2. The resistor R1 and the resistor R2 are connected in series with the band gap reference circuit 13.

A reference voltage VBGR generated by the band gap reference circuit 13 is voltage-divided by the resistor R1 and the resistor R2, and a resulting on-voltage von is applied to the operational amplifier 4. In this way, the on-voltage Von that does not depend on variations in manufacturing process, temperature, and the power source voltage is generated.

The generating circuit for the on-voltage Von is not limited to the on-voltage generating circuit 18. In order to impart a desired temperature coefficient to the on-voltage Von, the on-voltage Von may be generated from a proportional to absolute temperature (PTAT) power source. If resistance values of the on-current control variable resistor Ra, the resistor R1, and the resistor R2 of FIG. 2 are modified by a register, the register may also modify the on-voltage Von and the on-current Ion. The operational speed of the level shifter circuit 3 may be thus modified by the register.

Second Embodiment

A second embodiment of the disclosure is described below. For convenience of explanation, elements identical in functionality to those of the first embodiment described above are designated with the same reference numerals, and the discussion thereof is not repeated.

Figure 3:
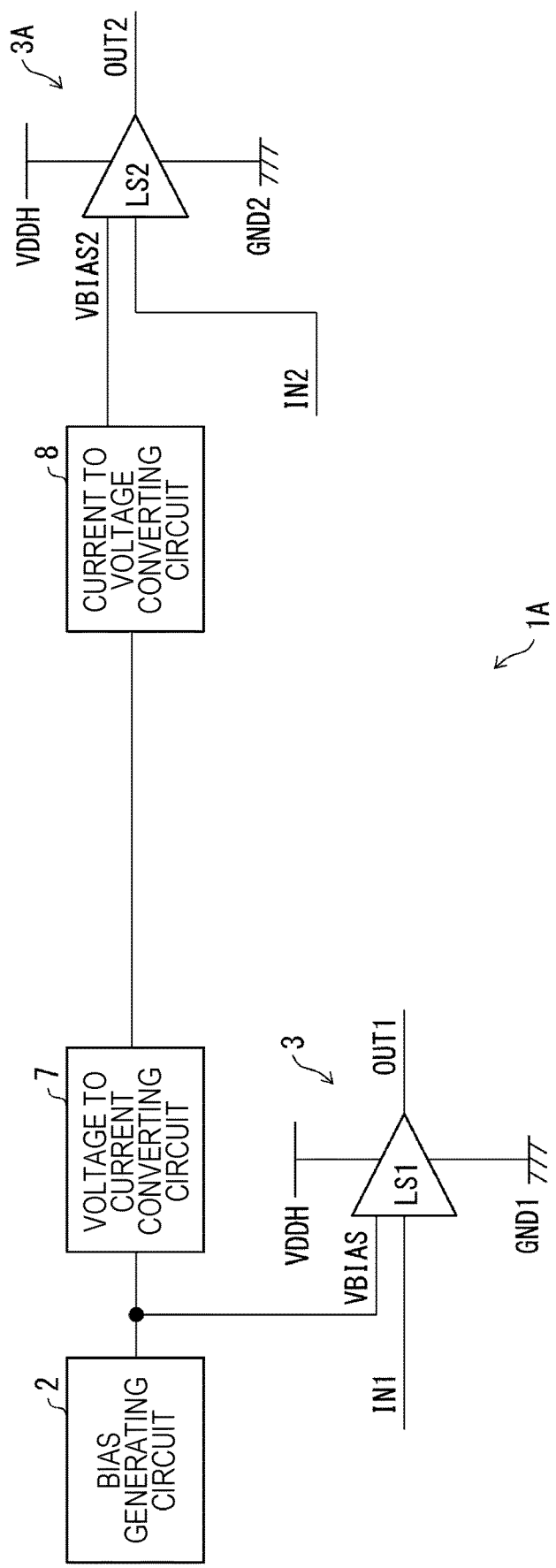
FIG. 3 is a circuit diagram of a signal level converter of a second embodiment.

FIG. 3 is a circuit diagram of a signal level converter 1A of the second embodiment. The signal level converter 1A includes the bias generating circuit 2, level shifter circuits 3 and 3A, a voltage to current converting circuit 7, and a current to voltage converting circuit 8. The level shifter circuit 3 is mounted close to the bias generating circuit 2 and directly receives the bias voltage VBIAS generated by the bias generating circuit 2. On the other hand, the level shifter circuit 3A is mounted at a location apart from the bias generating circuit 2. The voltage to current converting circuit 7 converts the bias voltage VBIAS generated by the bias generating circuit 2 into a current signal, and the current to voltage converting circuit 8 mounted close to the level shifter circuit 3A converts the current signal into a bias voltage VBIAS2. The bias voltage VBIAS2 is thus input to the level shifter circuit 3A.

Third Embodiment

A third embodiment of the disclosure is described below. For convenience of explanation, elements identical in functionality to those of the embodiments are designated with the same reference numerals and the discussion thereof is not repeated.

Figure 4:
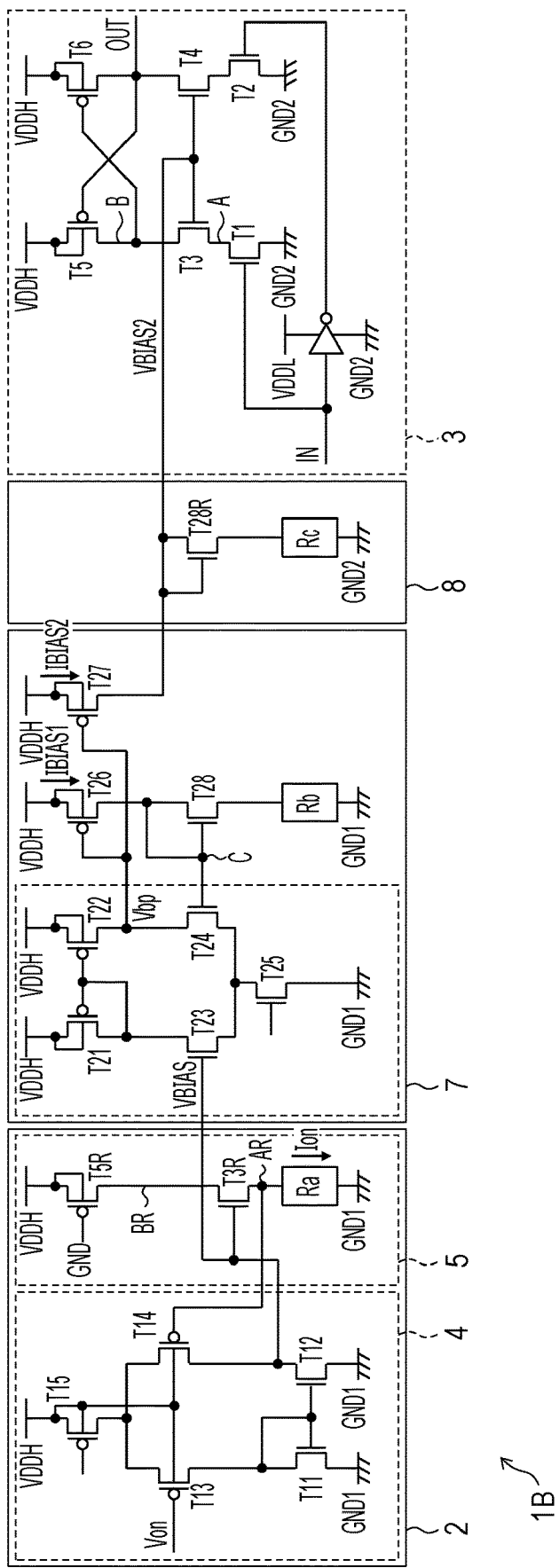
FIG. 4 is a circuit diagram of a signal level converter of a third embodiment.

FIG. 4 is a circuit diagram of a signal level converter 1B of the third embodiment. The signal level converter 1B includes the bias generating circuit 2, the voltage to current converting circuit 7, the current to voltage converting circuit 8, and the level shifter circuit 3.

FIG. 4 illustrates a specific circuit example of the bias generating circuit 2, the voltage to current converting circuit 7, the current to voltage converting circuit 8, and the level shifter circuit 3. The level shifter circuit 3 is mounted at a location apart from the bias generating circuit 2.

Referring to FIG. 4, if the bias voltage VBIAS output from the bias generating circuit 2 described with reference to FIG. 1A is applied to the gate of an N-type transistor T23 of the operational amplifier in the voltage to current converting circuit 7, the operational amplifier causes the voltage at the node C to be the bias voltage VBIAS. The operational amplifier outputs a gate voltage Vbp to be supplied to the gate of a P-type transistor T26. The P-type transistor T26 is a current source, and a bias current IBIAS1 flows through an N-type transistor T28 and a resistor Rb. A P-type transistor T27 serving as a current mirror circuit is a current source, and a bias current IBIAS2 flows through an N-type transistor T28R and a resistor Rc in the current to voltage converting circuit 8, generating VBIAS2 (=Vgs+IBIAS2×Rc+ΔGND). The bias current IBIAS2 is input to the level shifter circuit 3.

Vgs in the bias voltage VBIAS2 is a gate-source voltage of the N-type transistor T28R, and ΔGND is a voltage difference between the ground voltage GND (GND1) of the bias generating circuit 2 and the ground voltage GND (GND2) of the level shifter circuit 3. Vgs as the first term of the bias voltage VBIAS2 reflects variations in the transistor characteristics related to heating of a circuit close to the level shifter circuit 3, and ΔGND as the third term of the bias voltage VBIAS2 reflects a difference in the ground voltage GND caused by a wiring resistance between the bias generating circuit 2 and the level shifter circuit 3.

The on-current Ion, the bias current IBIAS1, and the bias current IBIAS2 are desirably equal to each other. The replica N-type transistor T3R, the N-type transistor T28, and the N-type transistor T28R are desirably equally sized, and the on-current control variable resistor Ra, the resistor Rb, and the resistor Rc are desirably equal to each other in resistance value. The disclosure is not limited to these conditions. For example, each of the bias current IBIAS1 and the bias current IBIAS2 may be set to be half the on-current Ion. In such a case, the same effect may be achieved if the gate width of each of the N-type transistor T28 and the N-type transistor T28R is set to he half the gate width of the replica N-type transistor T3R, and each of the resistor Rb and the resistor Rc is set to have twice the resistance of the on-current control variable resistor Ra.

Figure 5:
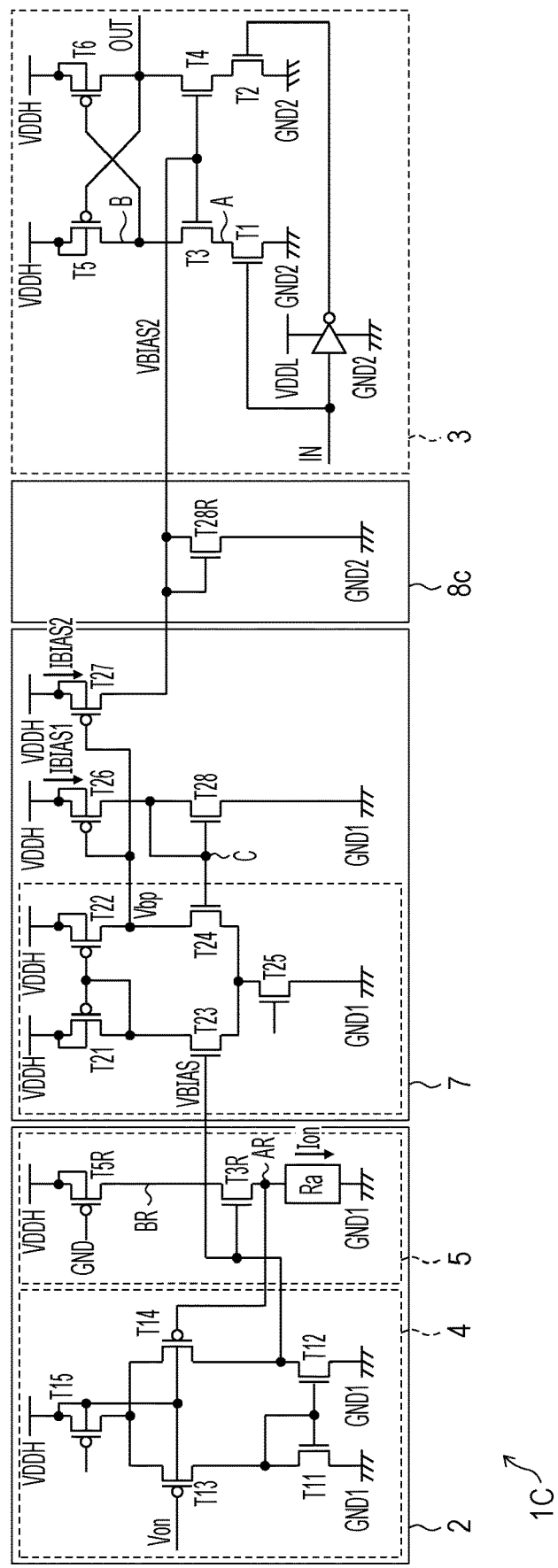
FIG. 5 is a circuit diagram of another signal level converter of the third embodiment.

FIG. 5 is a circuit diagram of a signal level converter 1C of the third embodiment. FIG. 4 illustrates a simpler circuit configuration in which the current to voltage converting circuit 8 close to the level shifter circuit 3 has a single transistor (the N-type transistor T28R) and a single resistor (the resistor Rc). FIG. 5 illustrates an even simpler circuit configuration in which a single transistor (the N-type transistor T28R) is employed.

Fourth Embodiment

Figure 6:
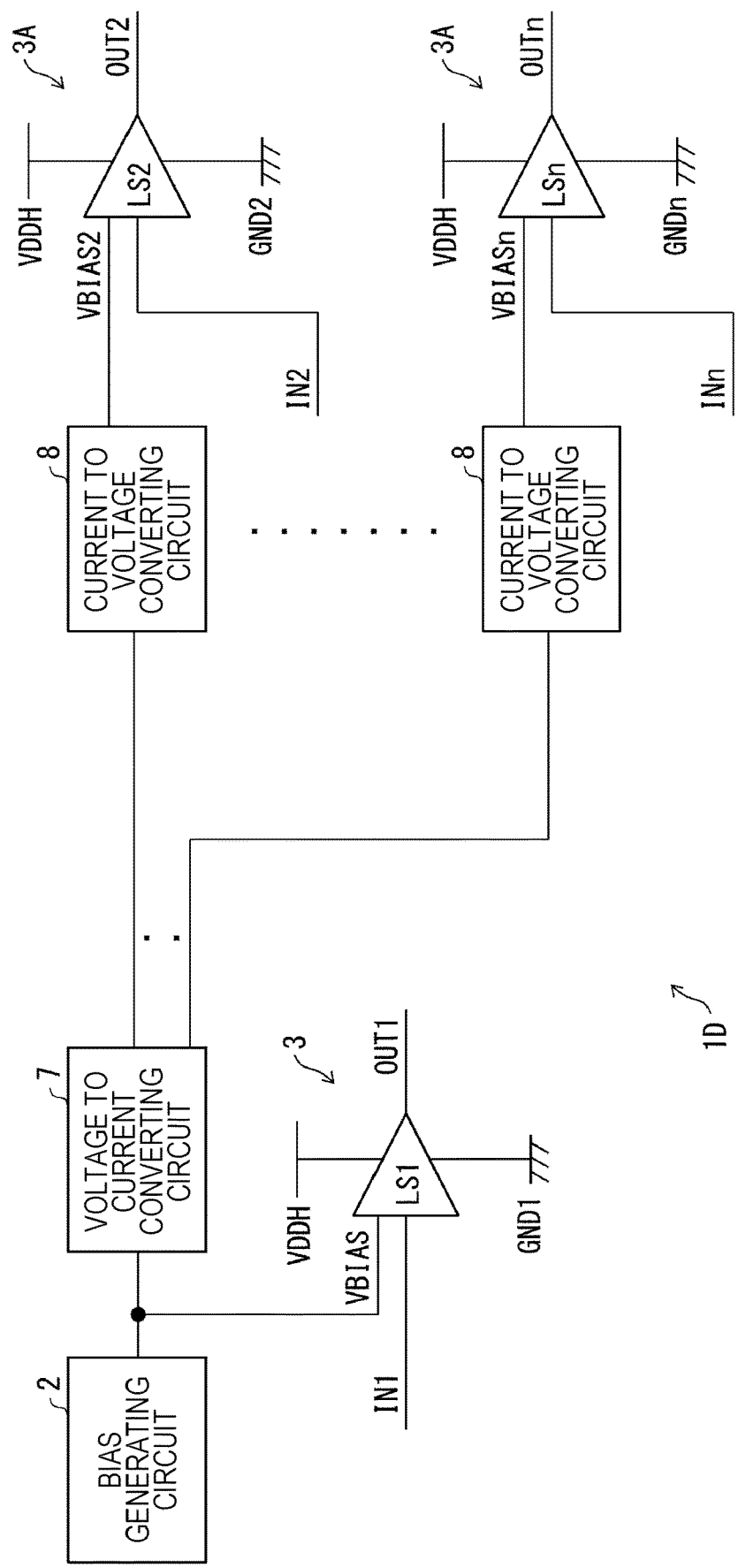
FIG. 6 is a circuit diagram of a signal level converter of a fourth embodiment.

FIG. 6 is a circuit diagram of a signal level converter ID of a fourth embodiment. The signal level converter ID includes the bias generating circuit 2, the level shifter circuit 3 connected to the bias generating circuit 2, the voltage to current converting circuit 7 connected to the bias generating circuit 2, multiple current to voltage converting circuits 8 connected in parallel with the voltage to current converting circuit 7, and the level shifter circuit 3A connected to each of the current to voltage converting circuits 8.

Figure 7:
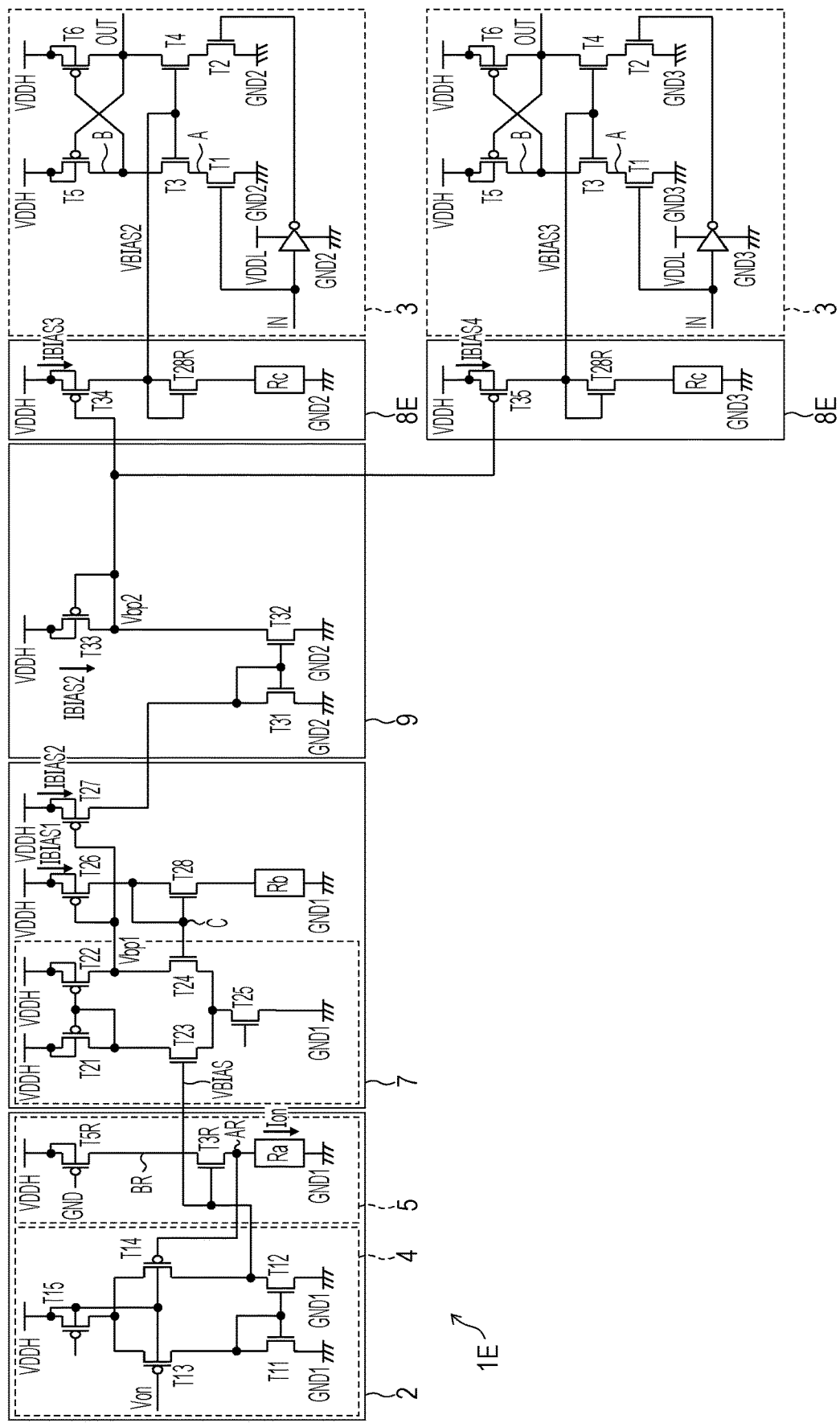
FIG. 7 is a circuit diagram of another signal level converter of the fourth embodiment.
Figure 8:
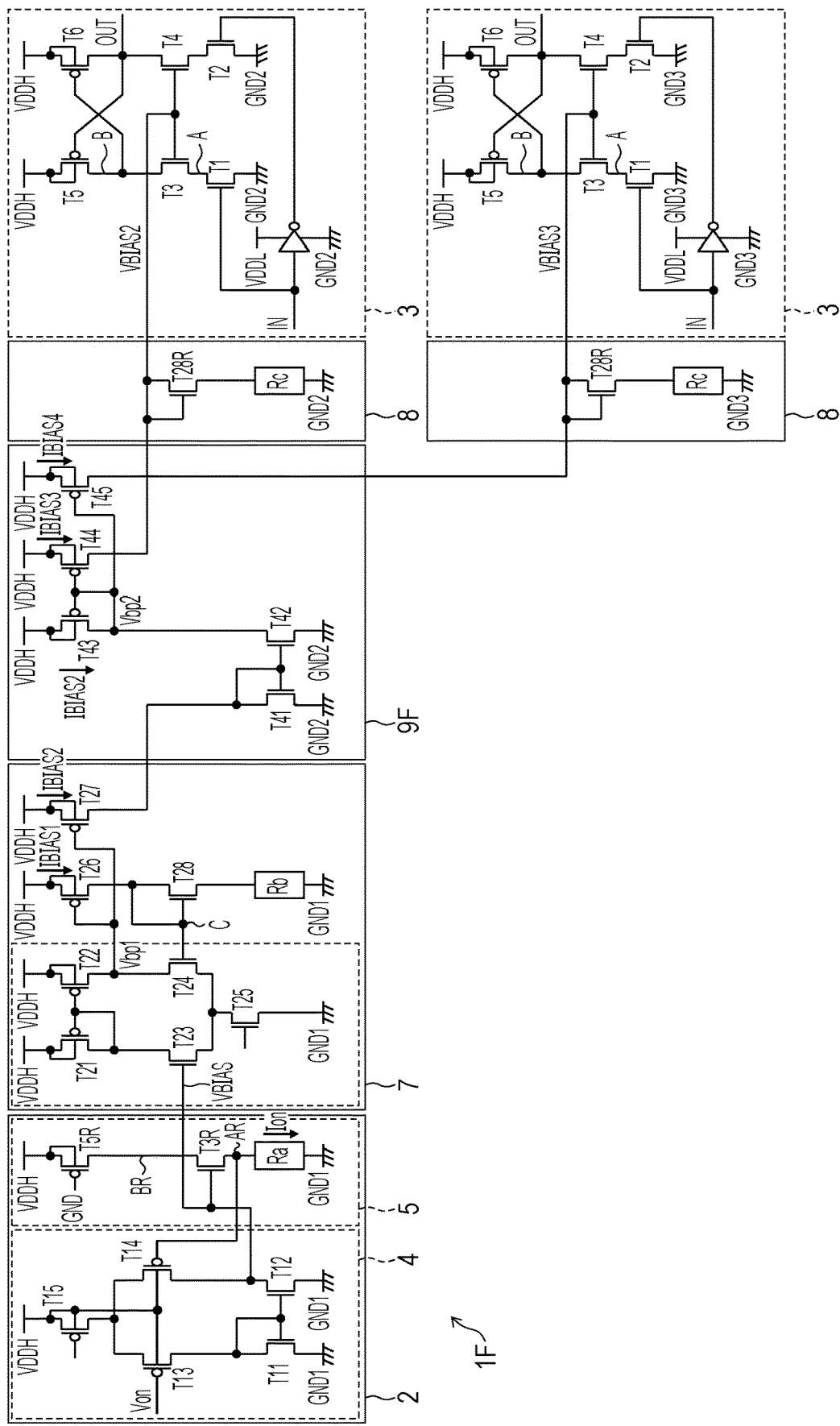
FIG. 8 is a circuit diagram of yet another signal level converter of the fourth embodiment.

According to the fourth embodiment, the multiple level shifter circuits 3 are mounted at locations apart from the bias generating circuit 2. FIGS. 6, 7, and 8 illustrate circuit examples.

Referring to FIG. 6, multiple P-type transistors T27, each serving as a current mirror circuit of the voltage to current converting circuit 7 of FIG. 4, are used as multiple current sources. The current sources are respectively connected to the current to voltage converting circuits 8. The current to voltage converting circuits 8 respectively generate bias voltages VBIASn for multiple level shifter circuits 3A, and thus input the bias voltages VBIASn to the level shifter circuits 3A.

Referring to FIG. 7 or FIG. 8, a repeater circuit 9 or 9F is arranged between the voltage to current converting circuit 7 and the current to voltage converting circuit 8 illustrated in FIG. 4.

If the bias voltages VBIASn are applied to the multiple level shifter circuits 3A in the configuration of FIG. 6, multiple wiring lines are connected from the voltage to current converting circuit 7. As a result, the number of wiring lines increases, leading to a lower layout efficiency.

The repeater circuit 9 converts one output from the voltage to current converting circuit 7 into multiple outputs, and includes N-type transistors T31 and T32, and a P-type transistor T33 serving as a current mirror circuit. In each current to voltage converting circuit 8E of FIG. 7, a gate voltage Vbp2 of a P-type transistor T33 in the repeater circuit 9 is applied to the gate of a P-type transistor T34. A bias current IBIAS3 that is a copy of the bias current IBIAS2 of the P-type transistor T33 flows through the N-type transistor T28R and the resistor Rc, thereby generating and applying the bias voltage VBIAS2 to the level shifter circuit 3. An increase in the number of the current to voltage converting circuits 8E of FIG. 7 causes the repeater circuit 9 to work with multiple level shifter circuits 3.

The repeater circuit 9F of FIG. 8 converts a single output from the voltage to current converting circuit 7 into multiple outputs, and includes N-type transistors T41 and T42, and P-type transistors T43, T44, and T45 serving as current mirror circuits. The P-type transistor T44 serves as a current source of a bias current IBIAS3 that is a copy of the bias current IBIAS2 of the P-type transistor T43, and supplies the bias current IBIAS3 to the current to voltage converting circuit 8, generates the bias voltage VBIAS2, and inputs the bias voltage VBIAS2 to the level shifter circuit 3. The addition of the P-type transistors T44 and T45 of FIG. 8 makes the repeater circuit 9F to easily work with multiple level shifter circuits 3. Alternatively, the voltage to current converting circuit 7 may be connected with the current to voltage converting circuits 8 via multiple repeater circuits 9F.

Fifth Embodiment

Figure 9:
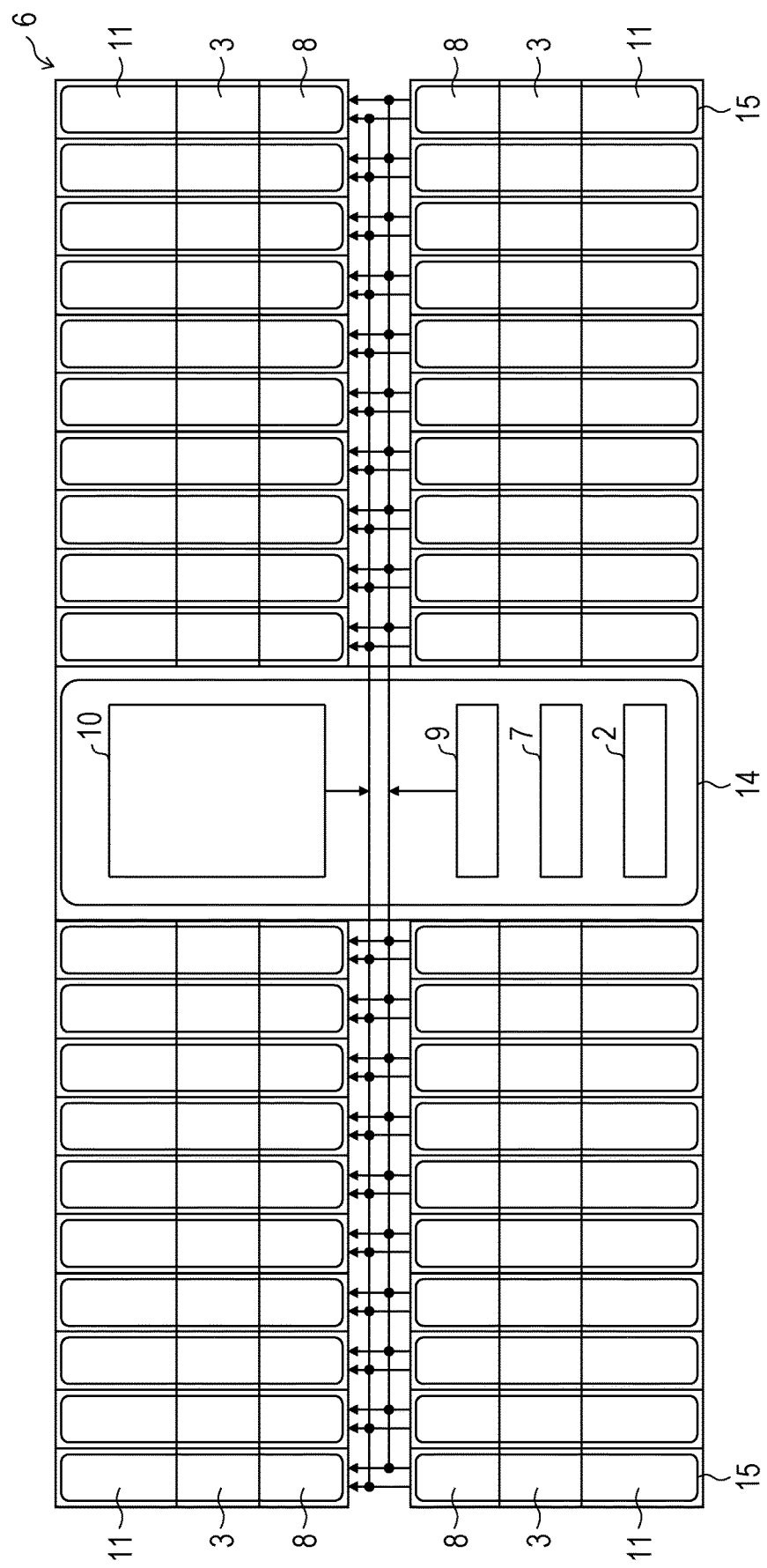
FIG. 9 is a block diagram illustrating a display driving device of a fifth embodiment.
Figure 10:
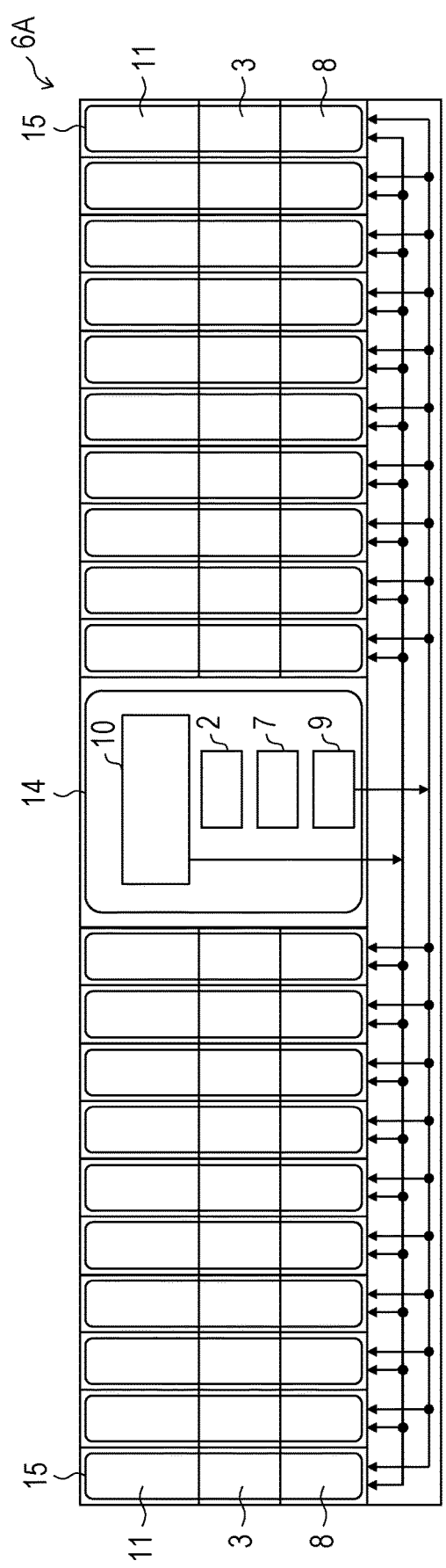
FIG. 10 is a block diagram illustrating another display driving device of the fifth embodiment.

FIG. 9 is a block diagram illustrating a display driving device 6 of a fifth embodiment. FIG. 10 is a block diagram illustrating another display driving device 6A of the fifth embodiment.

The display driving device 6 or 6A includes at least one first block 14 and at least one second block 15. The first block 14 includes the bias generating circuit 2 that generates the bias voltage VBIAS, the voltage to current converting circuit 7 that converts the bias voltage VBIAS generated by the bias generating circuit 2 into a bias current signal and outputs the bias current signal, and a control signal generating circuit 10 that generates a control signal. The second block 15 includes a display driving signal generating block 11 that generates a display driving signal, the current to voltage converting circuit 8 that converts the bias current signal output from the voltage to current converting circuit 7 into a bias voltage VBIAS, and the level shifter circuit 3 that converts an input signal IN (a lower voltage signal) into an output signal OUT (a higher voltage signal) in response to the bias voltage VBIAS. The number of the second blocks 15 is higher than the number of the first blocks 14.

The display driving device 6 or 6A illustrated in FIG. 9 or FIG. 10 includes multiple second blocks 15 on both sides of the first block 14. FIG. 9 illustrates the second blocks 15 arranged in two tiers. FIG. 10 illustrates the second blocks 15 arranged in a single tier.

The first block 14 includes the control signal generating circuit 10, the bias generating circuit 2, the voltage to current converting circuit 7, and the repeater circuit 9. The second block 15 includes the current to voltage converting circuit 8, the level shifter circuit 3, and the display driving signal generating block 11.

The first block 14 generates the control signal used for displaying, and supplies the control signal to the second block 15. The first block 14 also generates the bias voltage VBIAS used in the level shifter circuit 3, and converts the bias voltage VBIAS into a current and supplies the current to the second block 15.

The second block 15 converts the current converted from the bias voltage VBIAS back into a voltage, and then supplies the voltage to the level shifter circuit 3. The level shifter circuit 3 shifts the level of the control signal into the signal level of display driving, and then supplies the level-shifted control signal to the display driving signal generating block 11.

FIG. 9 and FIG. 10 illustrate examples of multiple second blocks 15. The circuit configuration of FIG. 7 involves a larger workload on the repeater circuit 9, and the circuit configuration of FIG. 8 involves the increased number of wirings. The configuration of FIG. 11 to be discussed below addresses the above problems.

Figure 11:
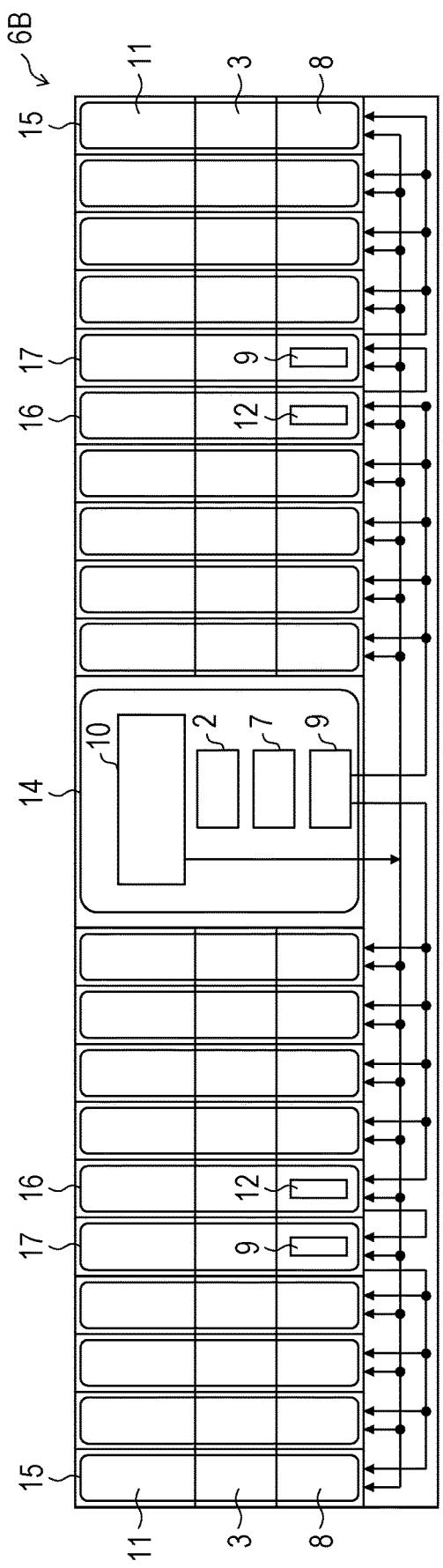
FIG. 11 is a block diagram illustrating yet another display driving device of the fifth embodiment.
Figure 12:
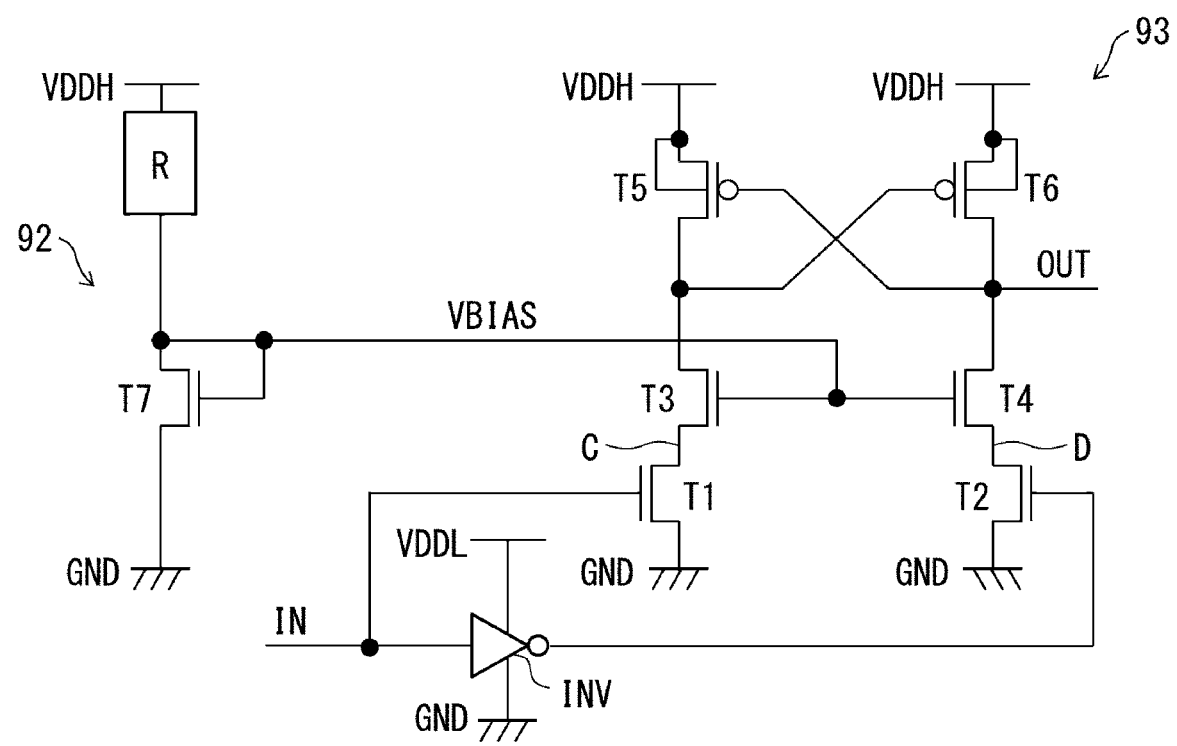
FIG. 12 is a circuit diagram of a bias generating circuit of the related art.

FIG. 11 is a block diagram illustrating a display driving device 6B of the fifth embodiment. The d splay driving device 6B includes at least one first block 14, at least one second block 15, at least one third block 16, and at least one fourth block 17. The first block 14 includes the bias generating circuit 2 that generates the bias voltage VBIAS, the voltage to current converting circuit 7 that converts the bias voltage VBIAS generated by the bias generating circuit 2 into a bias current signal and outputs the bias current signal, the repeater circuit 9 that distributes one output from the voltage to current converting circuit 7 to multiple output branches, and the control signal generating circuit 10 that generates the control signal. The second block 15 includes the display driving signal generating block 11 that generates the display driving signal, the current to voltage converting circuit 8 that converts the bias current signal output from the voltage to current converting circuit 7 into the bias voltage VBIAS, and the level shifter circuit 3 that converts the input signal IN (the lower voltage signal) into the output signal OUT (the higher voltage signal) in response to the bias voltage VBIAS. The third block 16 includes the display driving signal generating block 11, the current to voltage converting circuit 8, the level shifter circuit 3, and a current mirror circuit 12. The fourth block 17 includes the display driving signal generating block 11, the current to voltage converting circuit 8, the level shifter circuit 3, and the repeater circuit 9. The current mirror circuit 12 in the third block 16 is connected to the repeater circuit 9 in the fourth block 17. Each of the number of the third blocks 16 and the number of the fourth block 17 is higher than the number of the first blocks 14. The number of the second blocks 15 is higher than each of the number of the third blocks 16 and the number of the fourth blocks 17.

The display driving device 6B of FIG. 11 includes on each side of the first block 14 multiple second blocks 15, the third block 16, and the fourth block 17 in a single tier. The third block 16 includes the current mirror circuit 12 in addition to the elements of the second block. 15. The fourth block 17 includes the repeater circuit 9 in addition to the elements of the second block 15. The display driving device 6B of FIG. 11 may reduce the workload on the repeater circuit 9 in the first block 14 in the circuit configuration of FIG. 7.

The first block 14 generates the control signal for displaying, and supplies the control signal to the second block 15. The first block 14 also generates the bias voltage VBIAS used in the level shifter circuit 3, converts the bias voltage VBIAS into a current, and then supplies the current to the multiple second blocks 15 and the third block 16.

The third block 16 includes the current mirror circuit 12 in addition to the elements of the second block 15. The current mirror circuit 12 includes a P-type transistor T34R like the P-type transistor T34 of FIG. 7. The source of the P-type transistor T34R is connected to the higher power source voltage VDDH, and the gate of the P-type transistor T34R is connected to the gate voltage Vbp2. The P-type transistor T34R supplies to the fourth block 17 a current that is a copy of the bias current IBIAS2 of FIG. 7 The fourth block. 17 includes the repeater circuit 9 and the current to voltage converting circuit 8E of FIG. 7, and the gate voltage Vbp2 is supplied to the current to voltage converting circuit 8 in each second block 15.

High-resolution and large-scale design of a display panel cause the display driving device to output multiple display driving signal outputs and to be sized to be larger than a longitudinal chip length of 15 mm. For this reason, the bias generating circuit 2 is mounted apart from the level shifter circuit 3, creating the problem described in the section of Description of the Related Art. The circuit configurations described with reference to the first through fifth embodiments address the problem.

According to a first aspect of the disclosure, each of the signal level converter 1 through IF includes the bias generating circuit 2 that generates the bias voltage VBIAS, and the level shifter circuit 3 that converts the lower voltage signal (the input signal IN) into a higher voltage signal (the output signal OUT) in response to the bias voltage VBIAS. The bias generating circuit 2 includes the operational amplifier 4 that outputs the bias voltage VBIAS, and the replica circuit 5 that controls the on-current of the level shifter circuit 3 in response to a the bias voltage VBIAS output from the operational amplifier 4.

In the configuration described above, the on-current of the level shifter circuit is controlled in response to the bias voltage output from the operational amplifier. The on-current of the level shifter circuit is controlled at a higher accuracy level.

In each of the signal level converters 1 through IF of a second aspect of the disclosure in view of the first aspect, the level shifter circuit 3 may include the first higher withstand voltage P-type transistor T5, the first higher withstand voltage N-type transistor T3, and the first lower to medium withstand voltage N-type transistor T1 connected in series in that order, the second higher withstand voltage P-type transistor T6, the second higher withstand voltage N-type transistor T4, and the second lower to medium withstand voltage N-type transistor T2 connected series in that order. The bias voltage VBIAS may be supplied to a node of the gate of the first higher withstand voltage N-type transistor T3 and the gate of the second higher withstand voltage N-type transistor T4. The replica circuit 5 may include the replica P-type transistor T5R corresponding to the first higher withstand voltage P-type transistor T5, and the replica N-type transistor T3R corresponding to the first higher withstand voltage N-type transistor T3.

In the configuration described above, the bias voltage is supplied to the node of the gate of the first higher withstand voltage N-type transistor and the gate of the second higher withstand voltage N-type transistor in the level shifter circuit. The replica circuit includes the replica P-type transistor corresponding to the first higher withstand voltage P-type transistor, and the replica N-type transistor corresponding to the first higher withstand voltage N-type transistor. The on-current of the level shifter circuit is thus controlled.

In each of the signal level converters 1 through 1F according to a third as t of the disclosure, in view of the second aspect, the replica circuit 5 may include the on-current control variable resistor Ra that is connected to the side of the replica N-type transistor T3R opposite from the replica P-type T5R transistor to control the on-current Ion of the level shifter circuit 3, and the register that modifies the value of the on-current control variable resistor Ra.

In the configuration described above, the on-current Ion of the level shifter circuit is controlled by causing the register to change the value of the on-current control variable resistor.

According to a fourth aspect of the disclosure, in view of the first aspect, each of the signal level converters 1 through 1F may further include the voltage to current converting circuit 7 that converts the bias voltage VBIAS generated by the bias generating circuit 2 into the bias current signal and outputs the bias current signal, and the current to voltage converting circuit 8 that converts the bias current signal output from the voltage to current converting circuit 7 into the bias voltage VBIAS and supplies the bias voltage VBIAS to the level shifter circuit 3.

In the configuration described above, the voltage to current converting circuit converts the bias voltage generated by the bias generating circuit into the current signal, the current to voltage converting circuit close to the level shifter circuit converts the current signal into the voltage signal, and the voltage signal is then supplied to the level shifter circuit mounted apart from the bias generating circuit.

Each of the signal level converters 1E and 1F of a fifth aspect of the disclosure in view of the fourth aspect may further include the repeater circuit 9 or 9F that distributes one output from the voltage to current converting circuit 7 to a plurality of outputs branches.

In the configuration described above, the bias voltage may be supplied to multiple level shifter circuits arranged at locations apart from the bias generating circuit.

In each of the signal level converters 1E and 1F of a sixth aspect of the disclosure in view of the fifth aspect, the repeater circuit may be connected to the current to voltage converting circuit and another current to voltage converting circuit.

In the configuration described above, the bias voltage VBIAS may be supplied to multiple current to voltage converting circuits that are arranged at locations apart from the bias generating circuit.

According to a seventh aspect of the disclosure, each of the display driving devices 6 and 6A includes at least one first block 14 including the bias generating circuit 2 that generates the bias voltage VBIAS, the voltage to current converting circuit 7 that converts the bias voltage VBIAS generated by the bias generating circuit 2 into the bias current signal and outputs the bias current signal, and the control signal generating circuit 10 that generates the control signal, and at least one second block 15 including the display driving signal generating block 11 that generates the display driving signal, the current to voltage converting circuit 8 that converts the bias current signal output from the voltage to current converting circuit 7 into the bias voltage VBIAS, and the level shifter circuit 3 that converts the lower voltage signal (the input signal IN) into the higher voltage signal (the output signal OUT) in response to the bias voltage VBIAS. The number of the second blocks is higher than the number of the first blocks.

In the configuration described above, the bias voltage may be supplied to multiple level shifter circuits.

In each of the display driving device 6 and 6A of an eighth aspect of the disclosure in view of the seventh aspect, the first block may further include the repeater circuit that distributes one output from the voltage to current converting circuit to a plurality of output branches.

In the configuration described above, the repeater circuit may modify the number of the outputs of the voltage to current converting circuit, and may control the workload on the voltage to current converting circuit. The bias voltage may be supplied to multiple level shifter circuits.

According to a ninth aspect of the disclosure, the display driving device 6B includes at least one first block 14 including the bias generating circuit 2 that generates the bias voltage VBIAS, the voltage to current converting circuit 7 that converts the bias voltage VBIAS generated by the bias generating circuit 2 into the bias current signal and outputs the bias current signal, the repeater circuit 9 that distributes one output from the voltage to current converting circuit 7 to a plurality of output branches, and the control signal generating circuit 10 that generates the control signal, at least one second block 15 including the display driving signal generating block 1 that generates the display driving signal, the current to voltage converting circuit 6 that converts the bias current signal output from the voltage to current converting circuit 7 into the bias voltage VBIAS, and the level shifter circuit 3 that converts the lower voltage signal (the input signal IN) into the higher voltage signal (the output signal OUT) in response to the bias voltage VBIAS, at least one third block 16 including the display driving signal generating block 11, the current to voltage converting circuit 8, the level shifter circuit 3, and the current mirror circuit 12, and at least one fourth block 17 including the display driving signal generating block 11, the current to voltage converting circuit 8, the level shifter circuit 3, and the repeater circuit 9. The current mirror circuit 12 in the third block 16 is connected to the repeater circuit 9 in the fourth block 17. Each of the number of the third blocks 16 and the number of fourth blocks 17 is higher than the number of the first blocks 14. The number of the second blocks 15 is higher than each of the number of the third blocks 16 and the number of the fourth blocks 17.

In the configuration described above, the workload on the repeater circuit in each of the first block and the fourth block may be controlled, and an increase in the number of wirings for the bias current signal may be controlled.

In each of the display driving devices 6 and 6A of a tenth aspect of the disclosure in view of the seventh aspect, the level shifter circuit 3 in the second block 15 may convert a level of the control signal generated by the control signal generating circuit 10 in the first block 14.

In the configuration described above, the signal at the lower voltage level generated by the control signal generating circuit in the first block may converted into the signal at the higher voltage level in the second block.

The present disclosure contains subject matter related to that disclosed in Japanese Priority Patent Application JP 2017-229462 filed in the Japan Patent Office on Nov. 29, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A signal level converter comprising:
a bias generating circuit that generates a bias voltage; and
a level shifter circuit that converts a lower voltage signal into a higher voltage signal in response to the bias voltage,
wherein the level shifter includes a first higher withstand voltage transistor that applies the bias voltage to a gate, and
the bias generating circuit includes an operational amplifier that outputs the bias voltage,
a replica circuit that controls an on-current of the level shifter circuit in response to the bias voltage output from the operational amplifier,
wherein the replica circuit includes a replica transistor having a same characteristic as the first higher withstand voltage transistor that applies the bias voltage to the gate,
wherein the level shifter circuit comprises a first higher withstand voltage P-type transistor, a first higher withstand voltage N-type transistor, and a first lower to medium withstand voltage N-type transistor, connected in series in sequential order, and a second higher withstand voltage P-type transistor, a second higher withstand voltage N-type transistor, and a second lower to medium withstand voltage N-type transistor, and a second lower to medium withstand voltage N-type transistor connected in series in sequential order,
wherein the bias voltage is supplied to a node of a gate of the first higher withstand voltage N-type transistor and a gate of the second higher withstand voltage N-type transistor, and
wherein the replica circuit comprises a replica P-type transistor corresponding to the first higher withstand voltage P-type transistor and a replica N-type transistor corresponding to the first higher withstand voltage N-type transistor.

2. The signal level converter according to claim 1,
wherein the replica circuit comprises an on-current control variable resistor that is connected to a side of the replica N-type transistor opposite from the replica P-type transistor to control an on-current of the level shifter circuit; and
a register that modifies a value of the on-current control variable resistor.

3. The signal level converter according to claim 1, further comprising:
a voltage to current converting circuit that converts the bias voltage generated by the bias generating circuit into a bias current signal and outputs the bias current signal; and
a current to voltage converting circuit that converts the bias current signal output from the voltage to current converting circuit into the bias voltage and supplies the bias voltage to the level shifter circuit.

4. The signal level converter according to claim 3,
further comprising a repeater circuit that distributes one output from the voltage to current converting circuit to a plurality of output branches.

5. The signal level converter according to claim 4,
wherein the repeater circuit is connected to the current to voltage converting circuit and another current to voltage converting circuit.

6. A display driving device comprising:
at least one first block including a bias generating circuit that generates a bias voltage, a voltage to current converting circuit that converts the bias voltage generated by the bias generating circuit into a bias current signal and outputs the bias current signal, and a control signal generating circuit that generates a control signal; and
at least one second block including a display driving signal generating block that generates a display driving signal, a current to voltage converting circuit that converts the bias current signal output from the voltage to current converting circuit into the bias voltage, and a level shifter circuit that converts a lower voltage signal into a higher voltage signal in response to the bias voltage,
wherein a number of the second blocks is higher than a number of the first blocks.

7. The display driving device according to claim 6,
wherein the first block further comprises a repeater circuit that distributes one output from the voltage to current converting circuit to a plurality of output branches.

8. A display driving device comprising:
at least one first block including a bias generating circuit that generates a bias voltage, a voltage to current converting circuit that converts the bias voltage generated by the bias generating circuit into a bias current signal and outputs the bias current signal, a repeater circuit that distributes one output from the voltage to current converting circuit to a plurality of output branches, and a control signal generating circuit that generates a control signal;
at least one second block including a display driving signal generating block that generates a display driving signal, a current to voltage converting circuit that converts the bias current signal output from the voltage to current converting circuit into the bias voltage, and a level shifter circuit that converts a lower voltage signal into a higher voltage signal in response to the bias voltage;
at least one third block including the current to voltage converting circuit, the level shifter circuit, and a current mirror circuit; and
at least one fourth block including the display driving signal generating block, the current to voltage converting circuit, the level shifter circuit, and the repeater circuit,
wherein the current mirror circuit in the third block is connected to the repeater circuit in the fourth block,
wherein each of a number of the third blocks and a number of the fourth blocks is higher than a number of the first blocks, and
wherein a number of the second blocks is higher than each of the number of the third blocks and the number of the fourth blocks.

9. The display driving device according to claim 6,
wherein the level shifter circuit in the second block converts a level of the control signal generated by the control signal generating circuit in the first block.

* * * * *